US012713618B2

(12) United States Patent
Neumann et al.

(10) Patent No.: US 12,713,618 B2
(45) Date of Patent: Aug. 18, 2026

(54) SELF-ALIGNED PATTERNING OF PLATE LINES IN THREE-DIMENSIONAL FERROELECTRIC CAPACITORS

(71) Applicant: Intel Corporation, Santa Clara, CA (US)

(72) Inventors: Christopher M. Neumann, Portland, OR (US); Brian Doyle, Portland, OR (US); Nazila Haratipour, Portland, OR (US); Shriram Shivaraman, Hillsboro, OR (US); Sou-Chi Chang, Portland, OR (US); Uygar E. Avci, Portland, OR (US); Eungnak Han, Portland, OR (US); Manish Chandhok, Beaverton, OR (US); Nafees Aminul Kabir, Hillsboro, OR (US); Gurpreet Singh, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 17/958,202

(22) Filed: Sep. 30, 2022

(65) Prior Publication Data

US 2024/0114693 A1 Apr. 4, 2024

(51) Int. Cl.

| | |
|---|---|
| ***H10B 53/20*** | (2023.01) |
| ***H10B 53/10*** | (2023.01) |
| ***H10W 20/41*** | (2026.01) |
| ***H10W 20/42*** | (2026.01) |

(52) U.S. Cl.
CPC ............. *H10B 53/20* (2023.02); *H10B 53/10* (2023.02); *H10W 20/42* (2026.01); *H10W 20/435* (2026.01)

(58) Field of Classification Search
CPC . H10B 53/10–50; H10D 1/682; H10W 20/42; H10W 20/43; H10W 20/432; H10W 20/435
See application file for complete search history.

(56) References Cited

U.S. PATENT DOCUMENTS

2022/0343980 A1* 10/2022 Kamisaka ........... H10W 20/435

* cited by examiner

*Primary Examiner* — Thanhha S Pham
(74) *Attorney, Agent, or Firm* — Alliance IP, LLC

(57) ABSTRACT

In one embodiment, an apparatus includes a first metal layer, a second metal layer above the first metal layer, a first metal via generally perpendicular with and connected to the first metal layer, a second metal via generally perpendicular with and connected to the second metal layer, a third metal via generally perpendicular with and extending through the first metal layer and the second metal layer, a ferroelectric material between the third metal via and the first metal layer and between the third metal via and the second metal layer, and a hard mask material around a portion of the first metal via above the first metal layer and the second metal layer, around a portion of the second metal via above the first metal layer and the second metal layer, and around a portion of the ferroelectric material above the first metal layer and the second metal layer.

23 Claims, 13 Drawing Sheets

100

Top View

Side View

101

108

Grow spacer around exposed vias

106A

106B

106C

106D

106E

106F

106G

102A

102B

102C

102D

102E

104A

104B

104C

104D

100
Top View
112
102A
108
Side View
110
110
106A
106B
106C
106D
106E
106F
106G
102A
102B
102C
102D
102E
114A
114B
114C
114D
108
Etch away dielectric
Remove sacrificial
material and deposit metal Top View
Side View
100
116
108
110
106A
106B
106C
106D
106E
106F
106G
102A
102B
102C
102D
102E
114A
114B
114C
114D
Deposit ILD
to isolate rows of vias 200
Apply polymer on metal vias
201
Top View
208
208
201
206A
206B
206C
206D
206E
206F
206G
202E
204D
202D
204C
202C
204B
202B
204A
202A
Side View 200
DSA process forms lines over vias
Top View
Side View
201
210
202A
202B
202C
202D
202E
204A
204B
204C
204D
206A
206B
206C
206D
206E
206F
206G Top View
Side View
200
216
210
206A
206B
206C
206D
206E
206F
206G
202A
202B
202C
202D
202E
204A
204B
204C
204D
Deposit ILD and remove polymer mask

SELF-ALIGNED PATTERNING OF PLATE LINES IN THREE-DIMENSIONAL FERROELECTRIC CAPACITORS

BACKGROUND

Some techniques for fabricating three-dimensional ferroelectric capacitor structures may require a deep etch step that patterns a plate line connecting the various capacitors together. Without a self-aligned process additional masking and lithography steps may be required, which can introduce misalignment of the various layers within the structure.

DETAILED DESCRIPTION

Ferroelectric (FE) memory devices may be used for integrated memory applications in integrated circuit devices (e.g., memory on logic). FE memory devices may implement FE capacitors that are based on metal-FE-metal junctions, and the FE capacitors may store information based on a polarization in the FE material between the metal layers. For example, information may be read from the FE capacitors by applying voltages to one or both of the metal plates of the FE capacitor to determine a polarization of the FE material therebetween. A voltage needed to change the polarization may indicate the previous polarization state. One advantage of FE capacitors, especially in regard to their use in memory devices, is that FE capacitors do not leak in the same way that a DRAM capacitor would leak charge over time, as the information is stored as a polarization within the FE material layer. This allows for three-dimensional stacking of such devices, such as shown in the examples herein, which may improve the overall memory cell density.

Embodiments herein provide a self-aligned process for fabricating three-dimensional ferroelectric capacitor structures, and in particular, the formation of the plate lines using self-aligned methods to pattern them. In certain embodiments, a thick spacer may be formed around vias in the structure (which function as the capacitor inner nodes). The spacer can then be used as a hard mask for the plate line definition in the structure. In other embodiments, a line-type block copolymer can be used to form an outline of the plate lines using the tops of the vias as a template. The pattern could then be used to define a mask for the plate lines in the structure. Both of these processes may define the plate lines of the structure in a self-aligned manner, which allows for easier fabrication and reduces the number of overall patterning/lithography steps in the fabrication process, providing margin and cost benefits.

Figure 4:
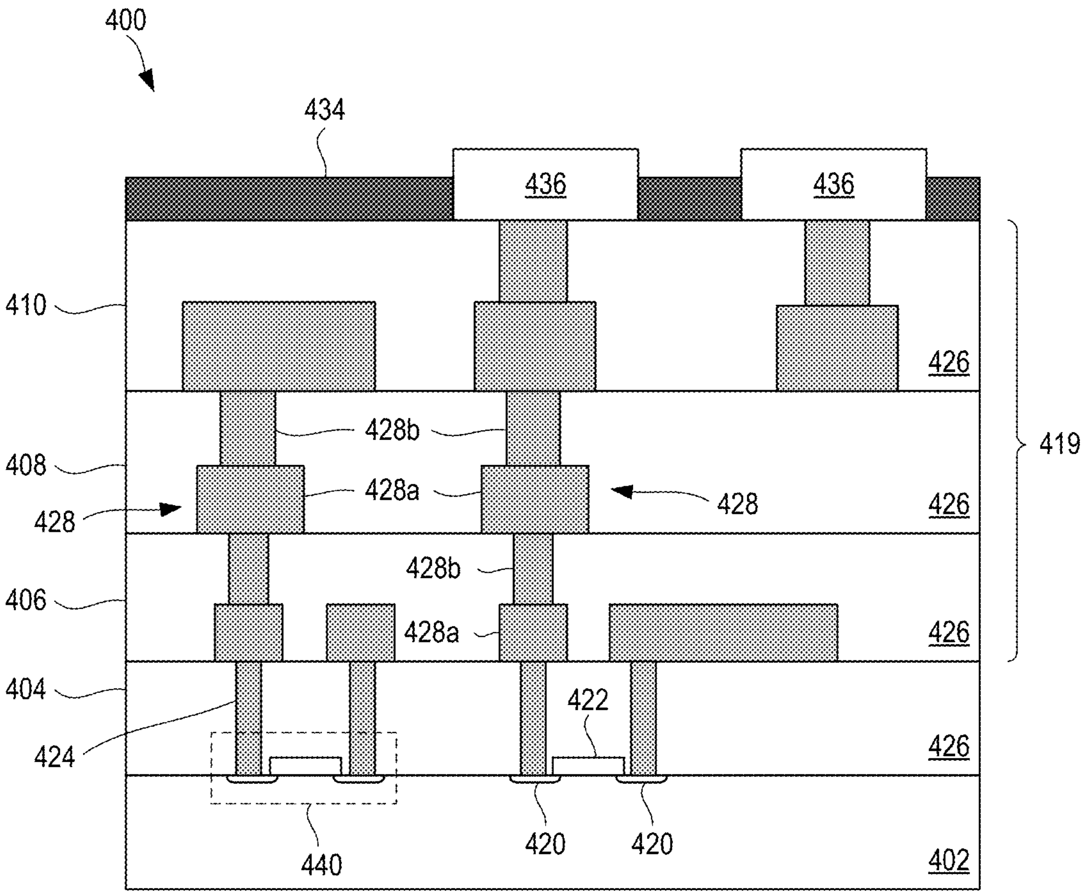
FIG. 4 is a cross-sectional side view of an integrated circuit device that may be included in a microelectronic assembly, in accordance with any of the embodiments disclosed herein.

The processes described herein may be used to form FE memory devices within integrated circuit devices such as integrated circuit device 400 of FIG. 4. In some embodiments, the processes described herein may be implemented after the front end of line (FEOL) processing (e.g., during the fabrication of the layers 402-404 of the integrated circuit device 400 of FIG. 4, where transistors of the integrated circuit device are formed) and during (or before, in some embodiments) the back end of line (BEOL) processing of the device (e.g., during the fabrication of the interconnect layers 406-410 of the integrated circuit device 400 of FIG. 4, where the FE memory devices are formed within the interconnect layers). In some embodiments, the FE memory devices can be formed separately and then placed within or on an integrated circuit device.

Figure 1A:
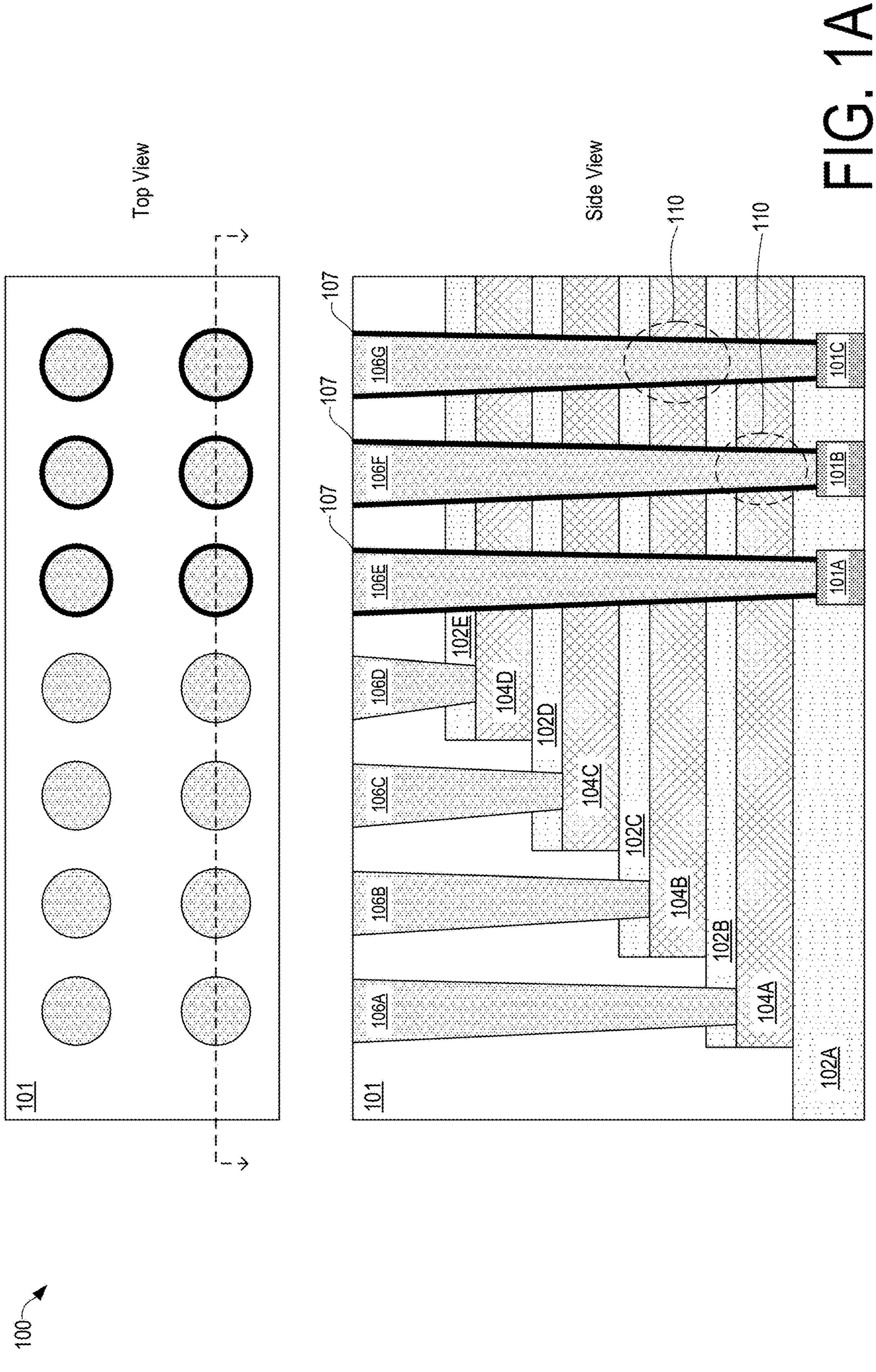
FIGS. 1A-1E illustrate an example process of fabricating a three-dimensional ferroelectric capacitor structure in accordance with embodiments herein.

FIGS. 1A-1E illustrate an example process of fabricating a three-dimensional ferroelectric capacitor structure 100 in accordance with embodiments herein. The process begins with the structure 100 shown in FIG. 1A, which may be formed in a "ferroelectric-first" manner in which the ferroelectric material in the structure (e.g., 107) is deposited shortly after the formation of the vias (e.g., 106) and thus, the ferroelectric material is in place at the beginning of the process as shown in FIG. 1A. However, embodiments herein may be applied to a structure similar to structure 100 that is formed in a "ferroelectric last" process in which the ferroelectric material is not deposited around the vias until after the process shown is performed (e.g., after metal 114 is deposited in place of the material layers 104) and thus, the ferroelectric material is not in place at the beginning of the process shown.

The example structure 100 includes alternating layers of dielectric materials 102 and sacrificial materials 104, with metal vias 106 that are generally perpendicular with the layers 102, 104 (e.g., vertical vias 106 vs. horizontal layers 102, 104 in the example shown). As used herein, generally perpendicular may refer to an angle of approximately 90°, e.g., between 88-92° or between 85-95°, with respect to two materials/layers. In some cases, this may refer to the angle between the centerlines of two materials/layers. For instance, in the example shown, the vias 106 have a conical shape (e.g., due to the fabrication methods used, e.g., etching, to create the vias) that is centered around a vertical centerline, and the generally perpendicular relationship between vias 106 may refer to the relationship between that centerline and the tops of the layers 102, 104 or a similar type of horizontal centerline of the layers 102, 104 (since the tops of such layers may not be perfectly flat).

The dielectric layers may be any suitable dielectric material (e.g., Silicon dioxide), and the metal vias 106 may include or be formed from Titanium Nitride, Tungsten, or similar types of metals. Certain of the vias 106 intersect with particular of the layers 104. For instance, the via 106A intersects with the layer 104A, the via 106B intersects with the layer 104B, the via 106C intersects with the layer 104C, and the via 106D intersects with the layer 104D. Other vias 106E, 106F, 106G extend through each of the layers 102, 104 and are in contact with metal contacts 101A, 101B, 101C, respectively, that are formed at the bottom of the structure. There are also ferroelectric (FE) materials 107A, 107B, 107C formed around each of the vias 106E, 106F, 106G, respectively (in the example shown, the FE materials surround and are concentric with their respective vias). The ferroelectric materials 107 may be a ferroelectric oxide material, such as Hafnium Zirconium Oxide, in certain embodiments. The layers 102, 104, vias 106, and FE materials 107 are surrounded in the structure 100 by a dielectric material 101 (e.g., Silicon dioxide), which may be a different dielectric material from the one used in the layers 102.

Figure 1B:
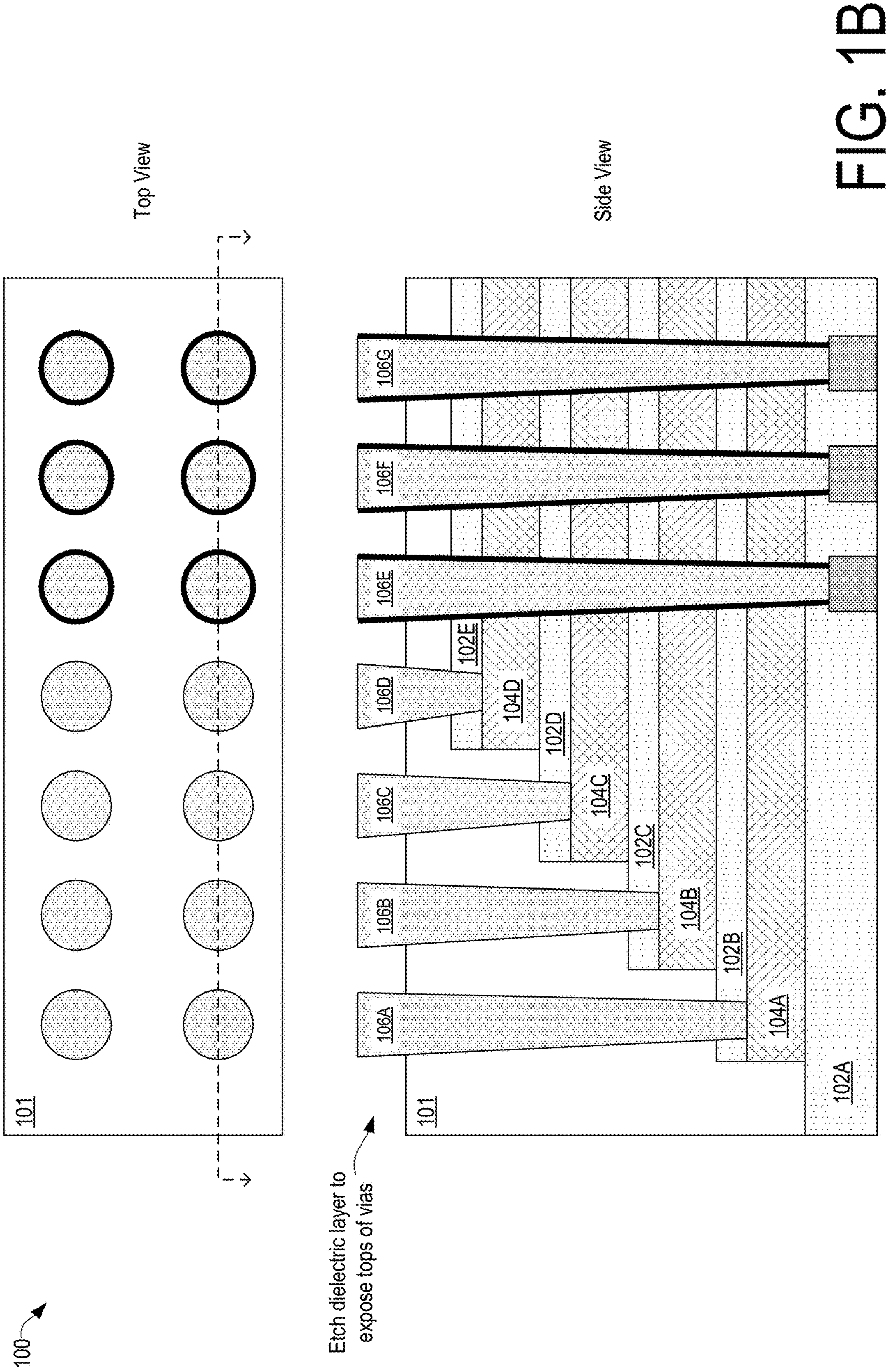
Figure 1C:
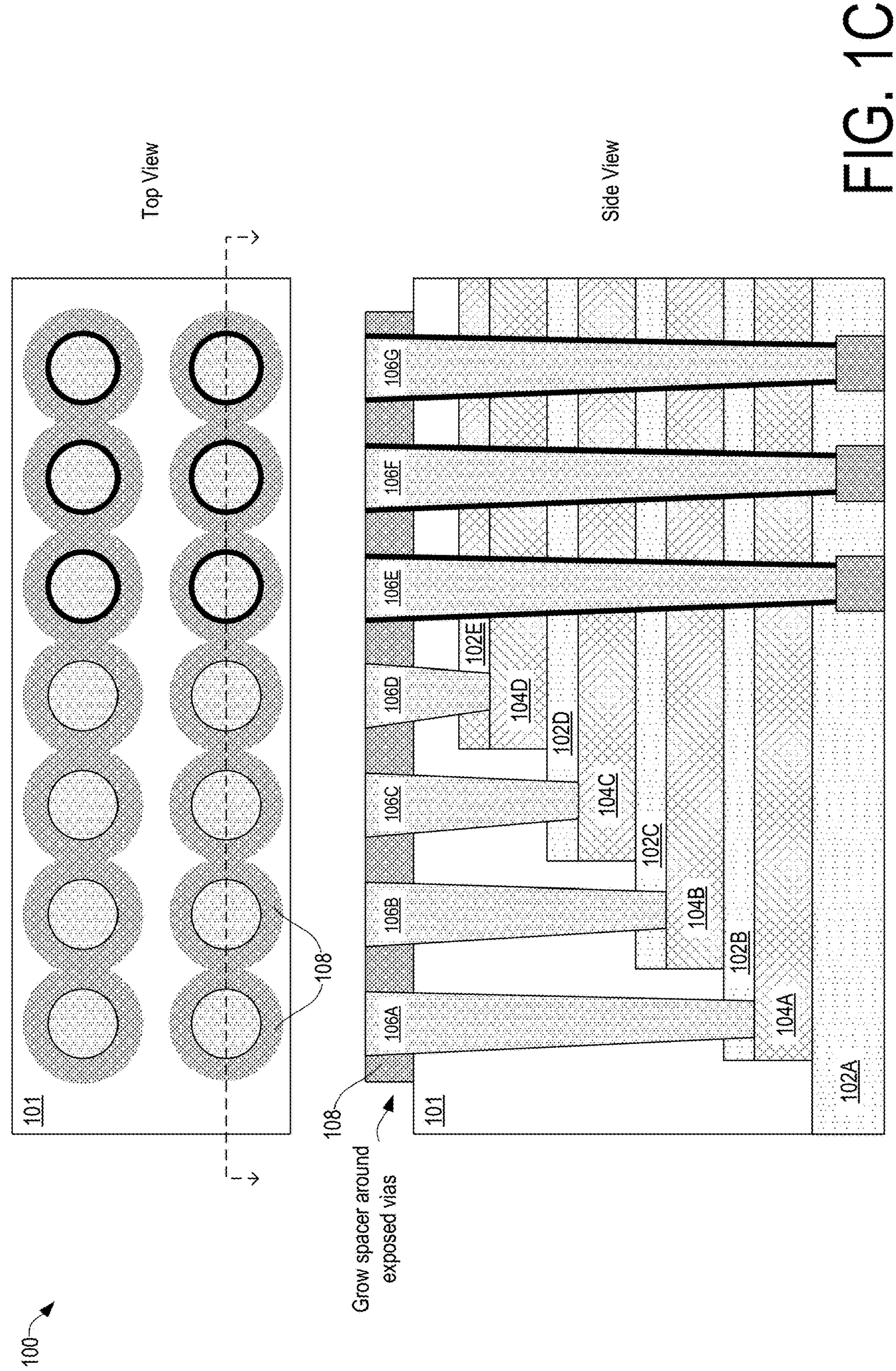
Figure 1D:
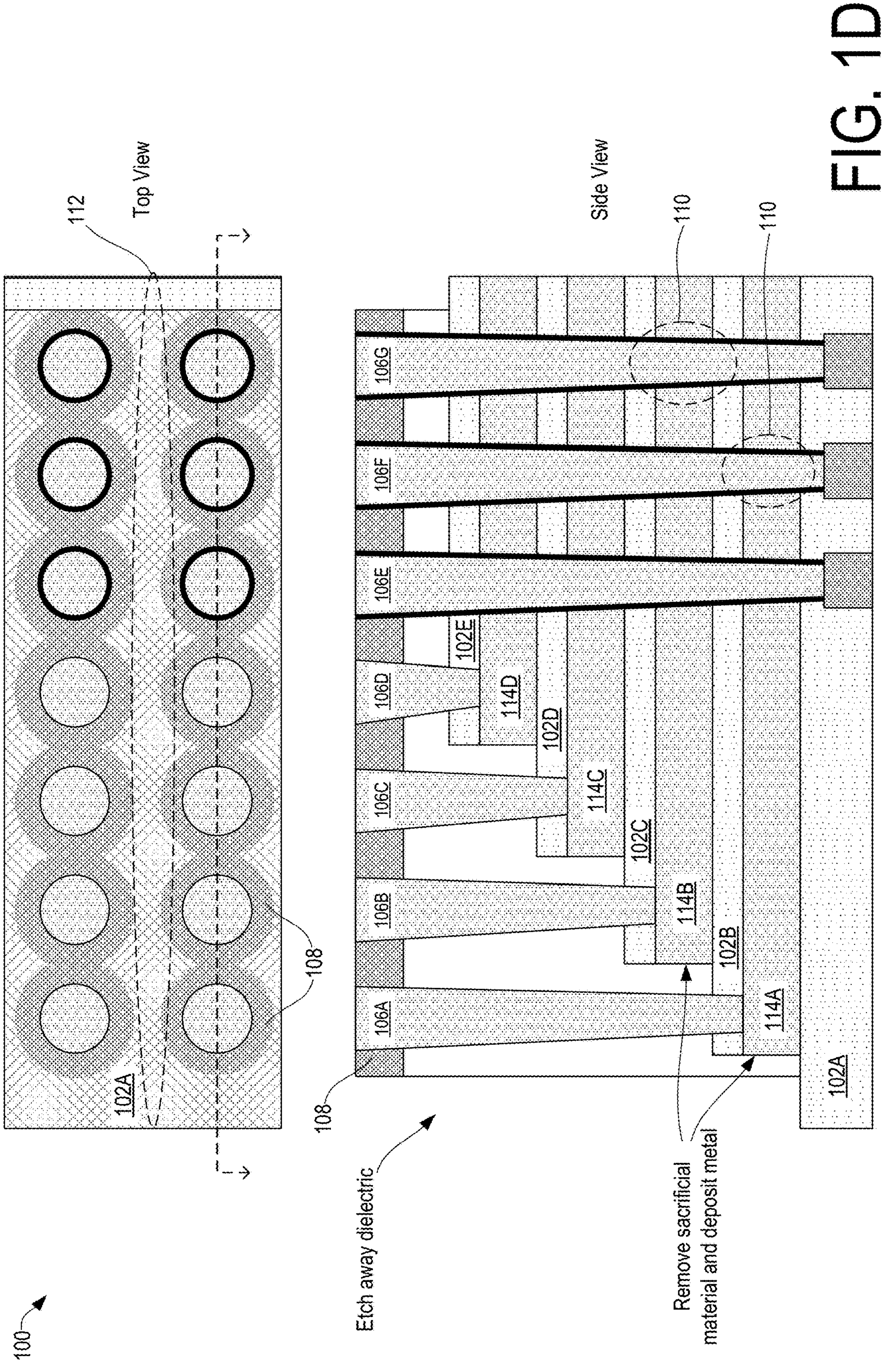

The sacrificial material layers 104 may be formed from Silicon Nitride (SiN) or a similar material in certain embodiments, and may be intended to be removed at a later processing step and replaced with metal 114 as shown in FIG. 1D (e.g., Titanium Nitride, Tungsten, or similar types of metals), which may then become part of a number of FE capacitors formed within the structure 100 (e.g., in the circled areas 110 shown in FIGS. 1A and 1D, where plate lines formed by the metal formed in place of the layers 104 intersect with the vias 106 with the FE material 107 in between the metal lines and the vias). These intersections form metal-FE-metal junctions that act as FE capacitors, which may be used to store information based on a polarization in the FE materials 107. For example, information may be read from the FE capacitors by applying voltages to one or both of the plate lines (formed in place of the layers 104) and the vias 106 to determine a polarization of the FE material therebetween.

Turning to FIG. 1B, the dielectric layer 101 is etched down to expose the tops of the metal vias 106 as shown. Turning then to FIG. 1C, a spacer material 108 may be grown around the exposed via tops as shown. The spacer material 108 may be grown via a conformal deposition process (e.g., an atomic layer deposition (ALD) or similar technique) that allows for a conformal deposition of the material 108 around the exposed vias 106. This would cause the spacer material 108 to be grown in a concentric manner with the exposed via tops, until the spacer material around each exposed via top begins growing into a neighboring spacer material as shown. This may occur with vias in the same row as one another but not with vias of other rows, due to the spacing between vias of the same row being closer than the spacing between vias of different rows as shown in FIGS. 1A-1E. In certain embodiments, the spacer material 108 is conformally deposited and then anisotropically etched, i.e., the etch occurs in the vertical direction so that horizontal areas normally clear faster than vertical ones, but do not clear in the areas between adjacent vias because the deposition of the material 108 "merges", to create the desired spacer/mask as shown. The spacer material 108 may be, for example, $Al_2O_3$ or $HfO_2$ in certain embodiments, or another type of material that can serve as a hard mask for etching the dielectric material 101 further down in the exposed vertical areas (e.g., circled area 112 shown in FIG. 1D) while leaving the dielectric material 101 intact under the spacer material 108 as shown in FIG. 1D.

The etching of the dielectric material 101 using the mask created by the material 108 exposes the material layers 104 in the stack so that they can be removed and replaced with a metal 114 to form the metal-FE-metal junctions as described above. In other embodiments, the material layers 104 may be initially formed as metal layers that are similarly etched in the non-masked areas (to separate the rows from one another).

Figure 1E:
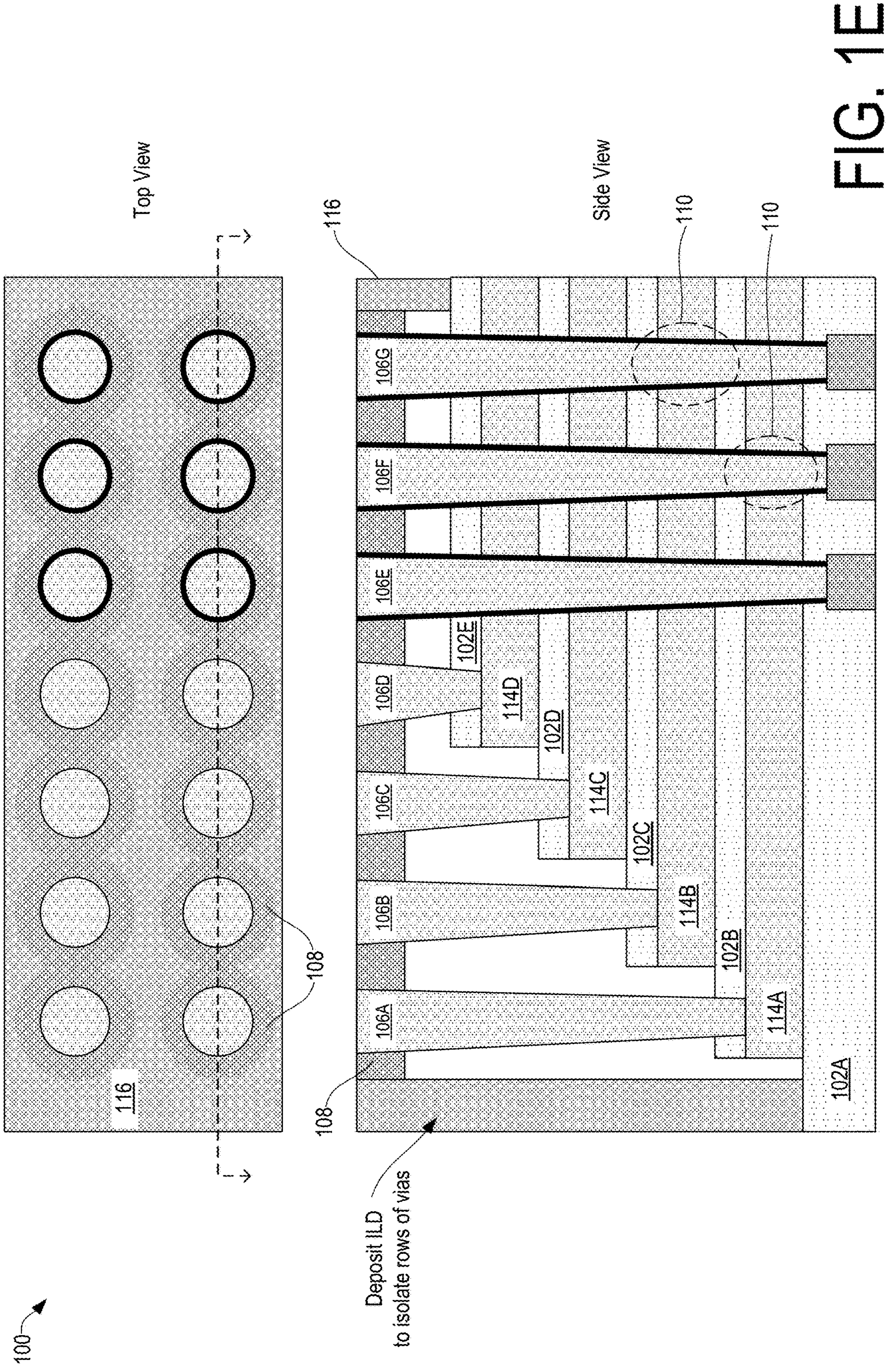

Once the metal 114 is in place as shown in FIG. 1D, an inter-layer dielectric (ILD) material 116 may be formed in the areas not covered by the hard mask (e.g., 112) as shown in FIG. 1E. The resulting structure then includes a three-dimensional stack of metal-FE-metal capacitors at the intersections of the metal plate lines 114 and the vias 106E, 106F, and 106G (e.g., 110). The number of FE capacitors may be defined by the number of metal-FE-metal intersections. For instance, in the example shown in FIG. 1E, there are 12 FE capacitors in each row of vias (i.e., 24 in the total structure shown in FIG. 1E since there are two rows of vias). Although a certain number of vertical vias and horizontal plate lines are shown in the example structure 100, the process described herein may be applied to a structure that includes fewer or additional vias 106 and/or fewer or additional metal plate lines 114.

Figure 2A:
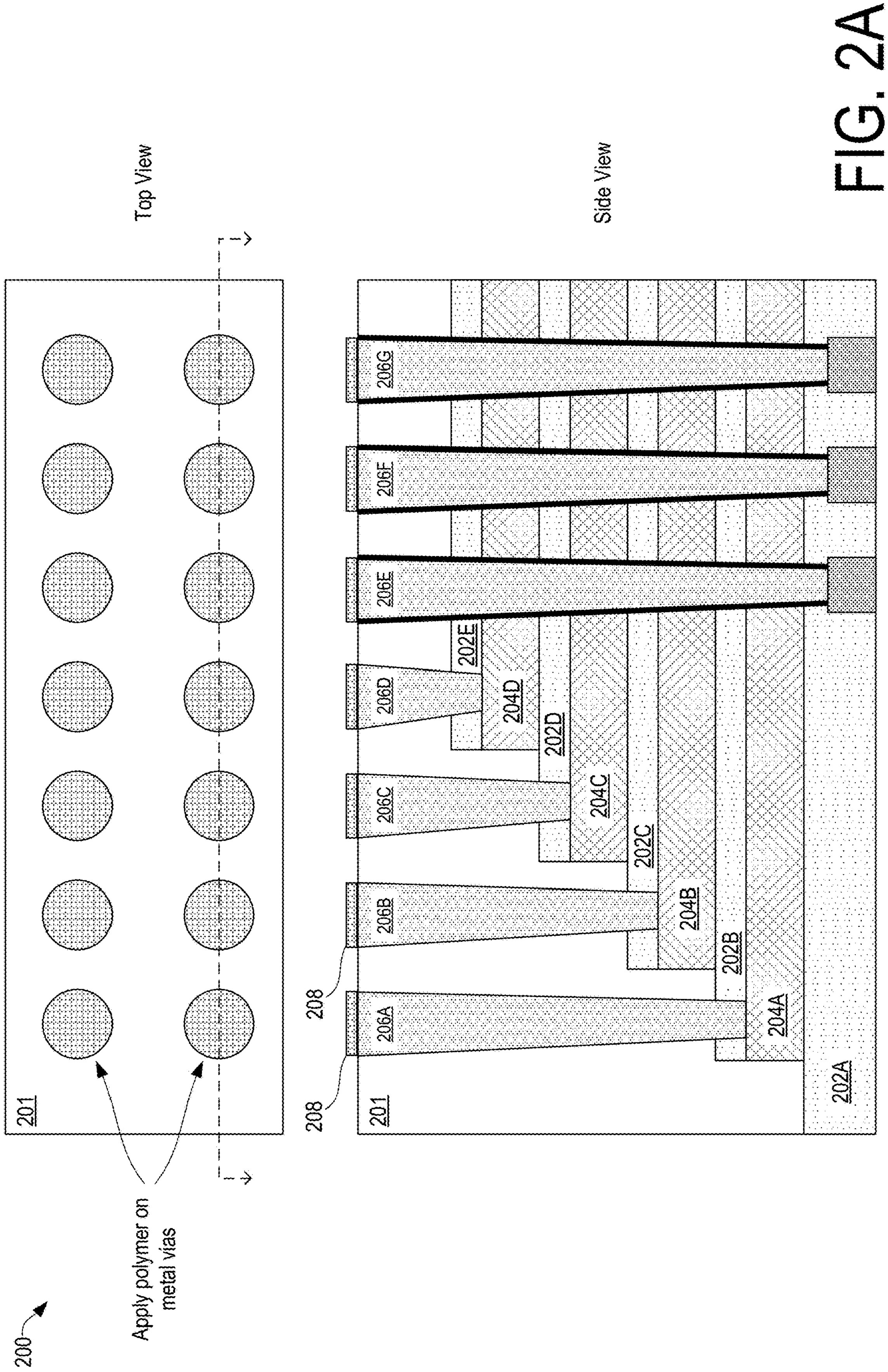
FIGS. 2A-2D illustrate another example process of fabricating a three-dimensional ferroelectric capacitor structure in accordance with embodiments herein.
Figure 2B:
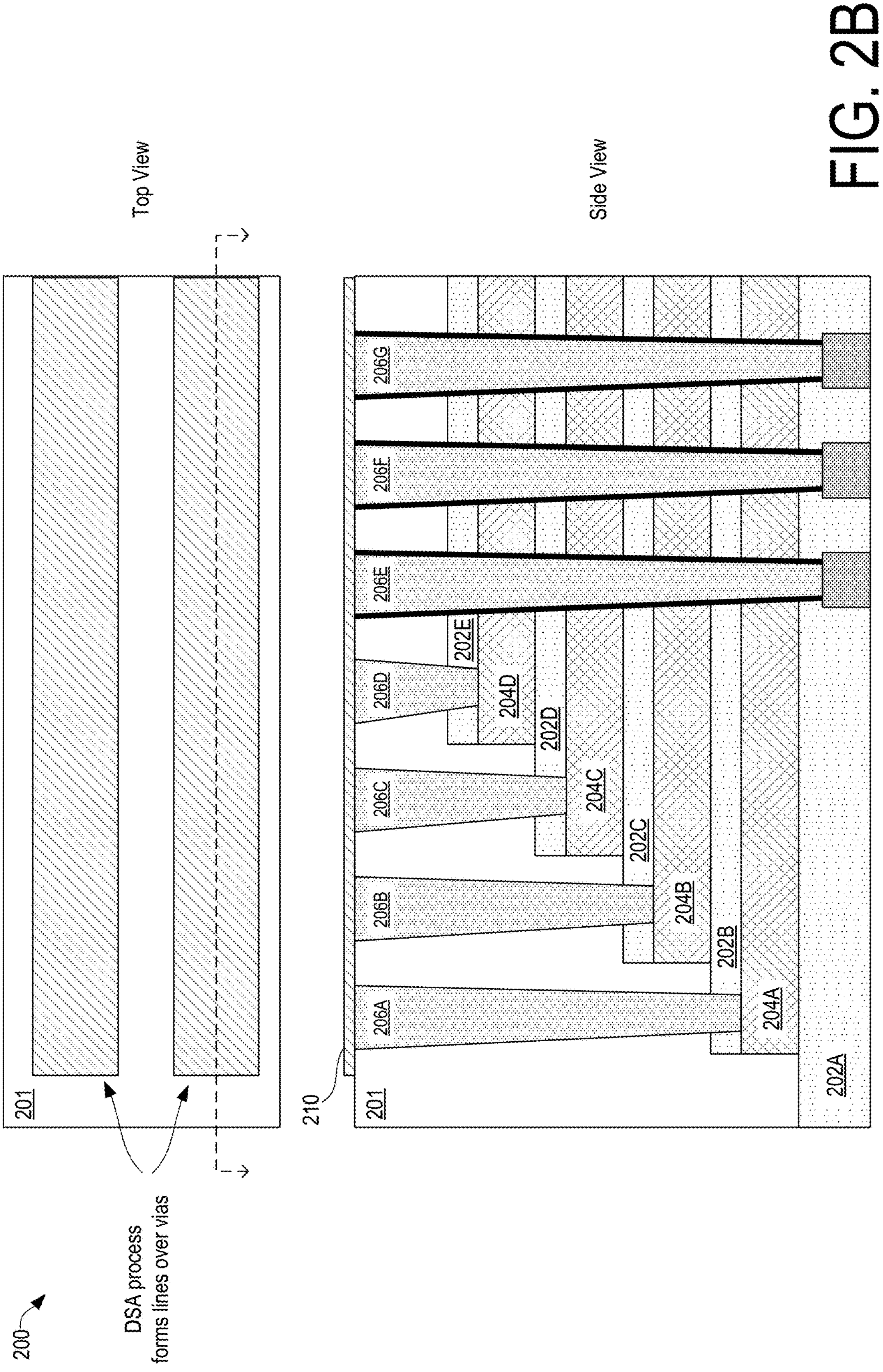

FIGS. 2A-2D illustrate another example process of fabricating a three-dimensional ferroelectric capacitor structure in accordance with embodiments herein. The example process begins in FIG. 2A with the structure 200 that is the same as structure 100 of FIG. 1A. In the approach shown in FIGS. 2A-2D, a directed self-assembly (DSA) process is used, e.g., with line-type block copolymers. The process begins as shown in FIG. 2A by applying a polymer material 208 on the tops of the metal vias 206. The polymer material 208 may have a metal selective functional group and may provide a chemical contrast between the tops of the vias 206 and the dielectric 201 so that a self-assembly process may be used, e.g., with a block polymer. Then, a block polymer may be deposited on the surface of the structure 200 and may selectively grow on the areas covered by the polymer 208 and in between the areas covered by the polymer 208, leaving the rows of vias covered by the polymer 210 (e.g., in a line or similar formation) as shown in FIG. 2B after annealing is performed. The remaining polymer 210 may then be used as a hard mask for etching as in the previously described process.

Figure 2C:
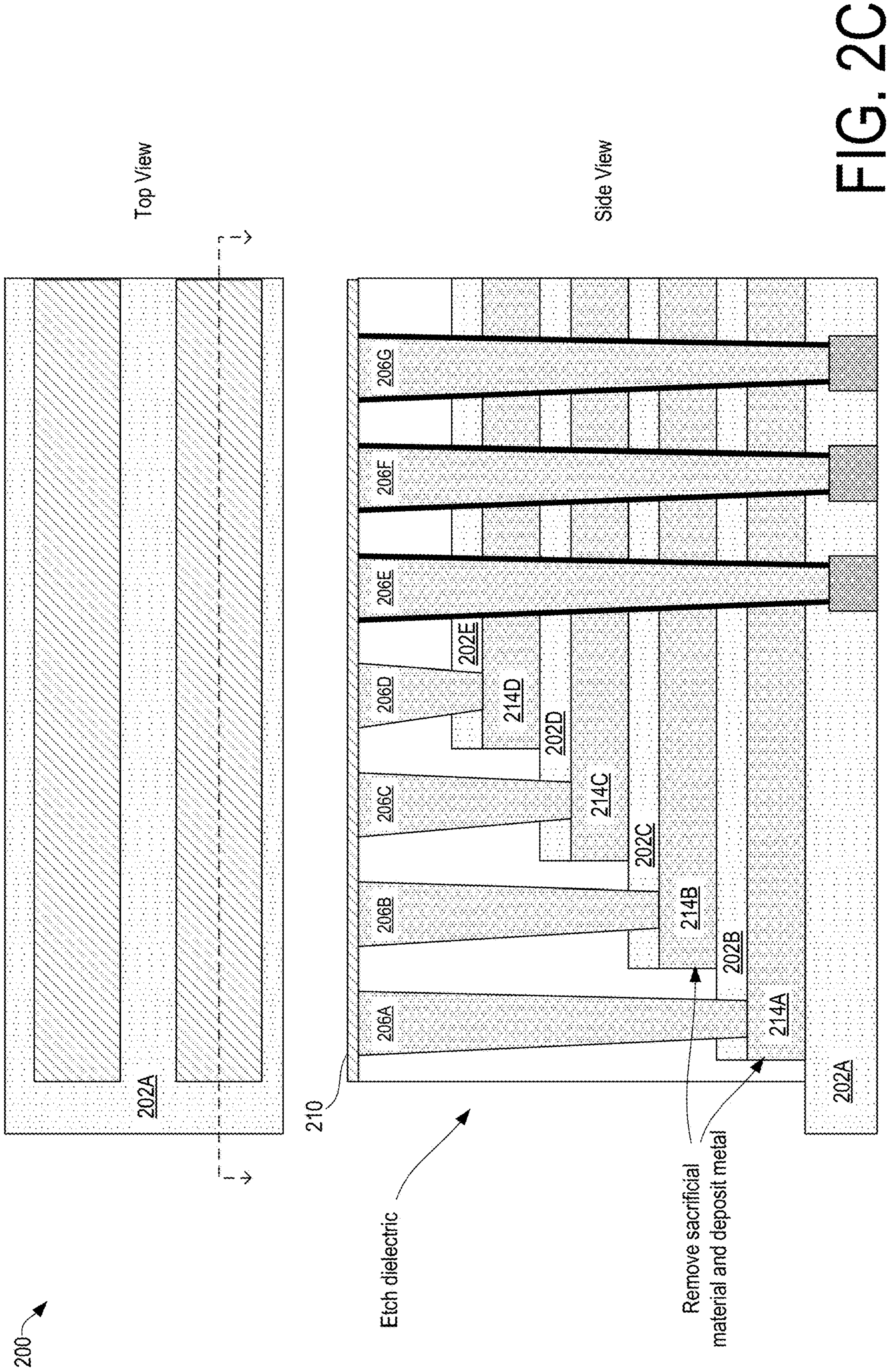
Figure 2D:
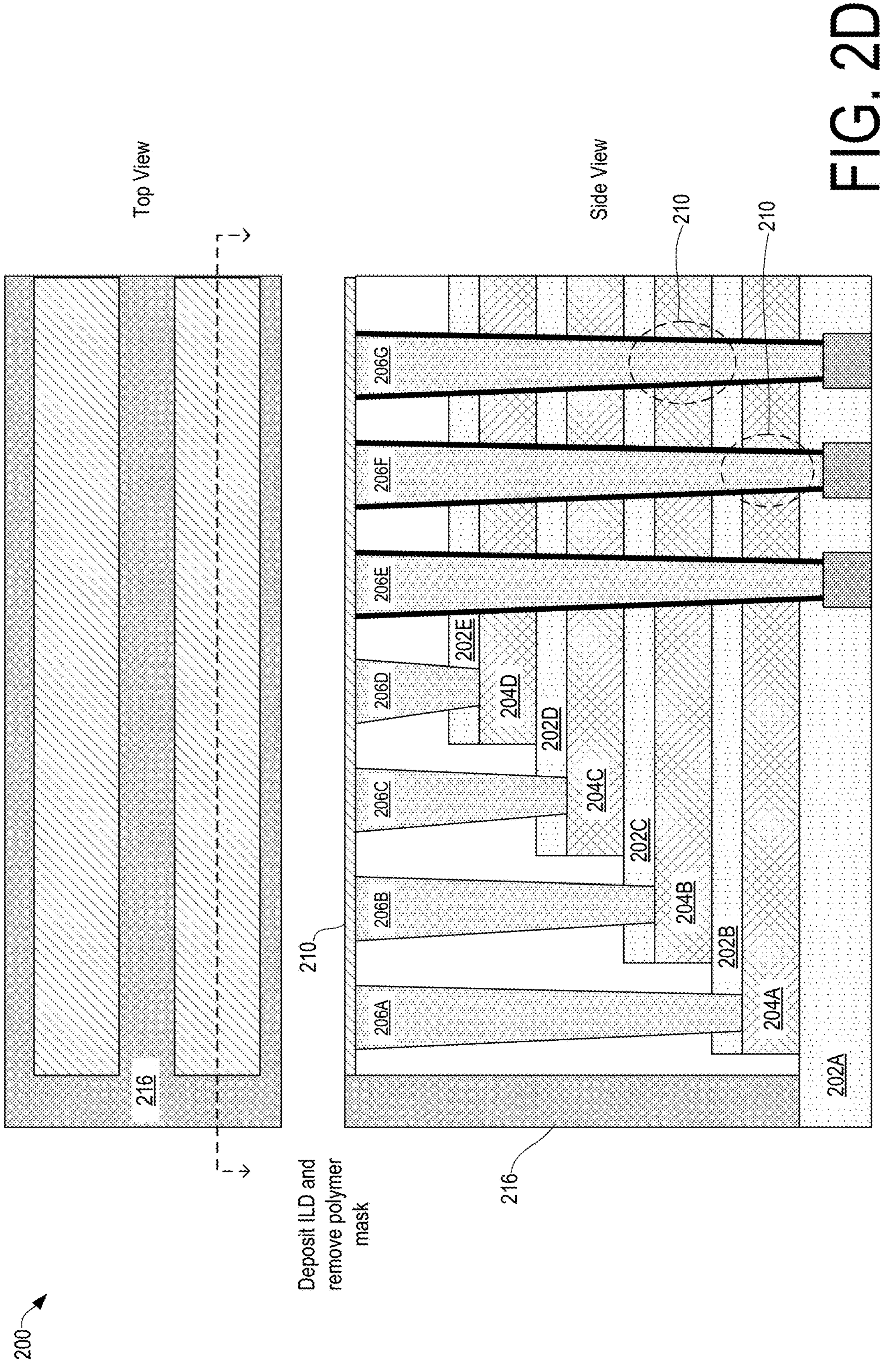

Turning to FIG. 2C, the dielectric material 201 is then etched down based on the mask provided by polymer 210, while still leaving the dielectric material 201 intact under the polymer 210 as shown. This then exposes the sacrificial material layers 204 in the stack, and the material layers 204 (e.g., Silicon Nitride (SiN) or a similar material) may then be removed and replaced with metal 214 as shown in FIG. 2C (e.g., Titanium Nitride, Tungsten, or similar types of metals) to form the FE capacitors of the structure. In other embodiments, the material layers 204 may be initially formed as metal layers that are similarly etched in the non-masked areas (to separate the rows from one another). Once the metal 214 is in place as shown in FIG. 2C, an inter-layer dielectric (ILD) material 216 may be formed in the areas not covered by the hard mask as shown in FIG. 2D. In some embodiments, the polymer 210 may be removed from the tops of the vias as well.

The resulting structure then includes a three-dimensional stack of metal-FE-metal capacitors at the intersections of the metal plate lines 214 and the vias 206E, 206F, and 206G (e.g., circled areas 210). The number of FE capacitors may be defined by the number of metal-FE-metal intersections. For instance, in the example shown in FIG. 2D, there are 12 FE capacitors in each row of vias (i.e., 24 in the total structure shown in FIG. 2D since there are two rows of vias). Although a certain number of vertical vias and horizontal plate lines are shown in the example structure 200, the process described herein may be applied to a structure that includes fewer or additional vias 206 and/or fewer or additional metal plate lines 214.

Figure 3:
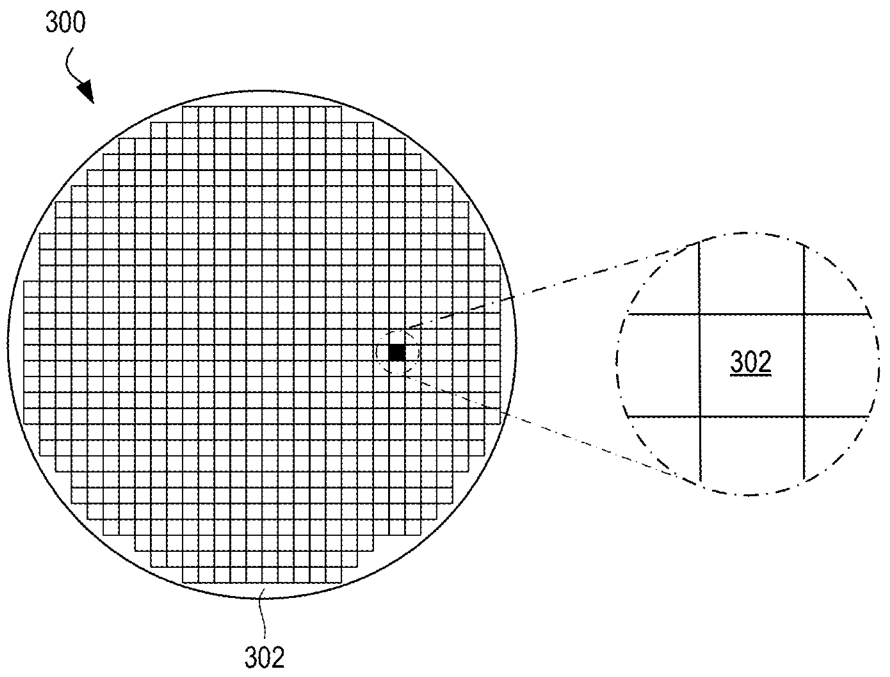
FIG. 3 is a top view of a wafer and dies that may be included in a microelectronic assembly, in accordance with any of the embodiments disclosed herein.

FIG. 3 is a top view of a wafer 300 and dies 302 that may implement any of the embodiments disclosed herein. The wafer 300 may be composed of semiconductor material and may include one or more dies 302 having integrated circuit structures formed on a surface of the wafer 300. The individual dies 302 may be a repeating unit of an integrated circuit product that includes any suitable integrated circuit. After the fabrication of the semiconductor product is complete, the wafer 300 may undergo a singulation process in which the dies 302 are separated from one another to provide discrete “chips” of the integrated circuit product. The die 302 may include one or more transistors (e.g., some of the transistors 440 of FIG. 4, discussed below), supporting circuitry to route electrical signals to the transistors, passive components (e.g., signal traces, resistors, capacitors, or inductors), and/or any other integrated circuit components. In some embodiments, the wafer 300 or the die 302 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 302. For example, a memory array formed by multiple memory devices may be formed on a same die 302 as a processor unit (e.g., the processor unit 602 of FIG. 6) or other logic that is configured to store information in the memory devices or execute instructions stored in the memory array.

FIG. 4 is a cross-sectional side view of an integrated circuit device 400 that may implement any of the embodiments disclosed herein. One or more of the integrated circuit devices 400 may be included in one or more dies 302 (FIG. 3). The integrated circuit device 400 may be formed on a die substrate 402 (e.g., the wafer 300 of FIG. 3) and may be included in a die (e.g., the die 302 of FIG. 3). The die substrate 402 may be a semiconductor substrate composed of semiconductor material systems including, for example, n-type or p-type materials systems (or a combination of both). The die substrate 402 may include, for example, a crystalline substrate formed using a bulk silicon or a silicon-on-insulator (SOI) substructure. In some embodiments, the die substrate 402 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 402. Although a few examples of materials from which the die substrate 402 may be formed are described here, any material that may serve as a foundation for an integrated circuit device 400 may be used. The die substrate 402 may be part of a singulated die (e.g., the dies 302 of FIG. 3) or a wafer (e.g., the wafer 300 of FIG. 3).

The integrated circuit device 400 may include one or more device layers 404 disposed on the die substrate 402. The device layer 404 may include features of one or more transistors 440 (e.g., metal oxide semiconductor field-effect transistors (MOSFETs)) formed on the die substrate 402. The transistors 440 may include, for example, one or more source and/or drain (S/D) regions 420, a gate 422 to control current flow between the S/D regions 420, and one or more S/D contacts 424 to route electrical signals to/from the S/D regions 420. The transistors 440 may include additional features not depicted for the sake of clarity, such as device isolation regions, gate contacts, and the like. The transistors 440 are not limited to the type and configuration depicted in FIG. 4 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Returning to FIG. 4, a transistor 440 may include a gate 422 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 440 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 440 along the source-channel-drain direction, the gate electrode may consist of a U-shaped structure that includes a bottom portion substantially parallel to the surface of the die substrate 402 and two sidewall portions that are substantially perpendicular to the top surface of the die substrate 402. In other embodiments, at least one of the metal layers that form the gate electrode may simply be a planar layer that is substantially parallel to the top surface of the die substrate 402 and does not include sidewall portions substantially perpendicular to the top surface of the die substrate 402. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 420 may be formed within the die substrate 402 adjacent to the gate 422 of individual transistors 440. The S/D regions 420 may be formed using an implantation/diffusion process or an etching/deposition process, for example. In the former process, dopants such as boron, aluminum, antimony, phosphorous, or arsenic may be ion-implanted into the die substrate 402 to form the S/D regions 420. An annealing process that activates the dopants and causes them to diffuse farther into the die substrate 402 may follow the ion-implantation process. In the latter process, the die substrate 402 may first be etched to form recesses at the locations of the S/D regions 420. An epitaxial deposition process may then be carried out to fill the recesses with material that is used to fabricate the S/D regions 420. In some implementations, the S/D regions 420 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 420 may be formed using one or more alternate semiconductor materials such as germanium or a group III-V material or alloy. In further embodiments, one or more layers of metal and/or metal alloys may be used to form the S/D regions 420.

Electrical signals, such as power and/or input/output (I/O) signals, may be routed to and/or from the devices (e.g., transistors 440) of the device layer 404 through one or more interconnect layers disposed on the device layer 404 (illustrated in FIG. 4 as interconnect layers 406-410). For example, electrically conductive features of the device layer 404 (e.g., the gate 422 and the S/D contacts 424) may be electrically coupled with the interconnect structures 428 of the interconnect layers 406-410. The one or more interconnect layers 406-410 may form a metallization stack (also referred to as an "ILD stack") 419 of the integrated circuit device 400.

The interconnect structures 428 may be arranged within the interconnect layers 406-410 to route electrical signals according to a wide variety of designs; in particular, the arrangement is not limited to the particular configuration of interconnect structures 428 depicted in FIG. 4. Although a particular number of interconnect layers 406-410 is depicted in FIG. 4, embodiments of the present disclosure include integrated circuit devices having more or fewer interconnect layers than depicted.

In some embodiments, the interconnect structures 428 may include lines **428*a* and/or vias 428*b* filled with an electrically conductive material such as a metal. The lines 428*a* may be arranged to route electrical signals in a direction of a plane that is substantially parallel with a surface of the die substrate 402 upon which the device layer 404 is formed. For example, the lines 428*a* may route electrical signals in a direction in and out of the page and/or in a direction across the page from the perspective of FIG. 4. The vias 428*b* may be arranged to route electrical signals in a direction of a plane that is substantially perpendicular to the surface of the die substrate 402 upon which the device layer 404 is formed. In some embodiments, the vias 428*b* may electrically couple lines 428*a* of different interconnect layers 406-410** together.

The interconnect layers 406-410 may include a dielectric material 426 disposed between the interconnect structures 428, as shown in FIG. 4. In some embodiments, dielectric material 426 disposed between the interconnect structures 428 in different ones of the interconnect layers 406-410 may have different compositions; in other embodiments, the composition of the dielectric material 426 between different interconnect layers 406-410 may be the same. The device layer 404 may include a dielectric material 426 disposed between the transistors 440 and a bottom layer of the metallization stack as well. The dielectric material 426 included in the device layer 404 may have a different composition than the dielectric material 426 included in the interconnect layers 406-410; in other embodiments, the composition of the dielectric material 426 in the device layer 404 may be the same as a dielectric material 426 included in any one of the interconnect layers 406-410.

A first interconnect layer 406 (referred to as Metal 1 or "M1") may be formed directly on the device layer 404. In some embodiments, the first interconnect layer 406 may include lines **428*a* and/or vias 428*b*, as shown. The lines 428*a* of the first interconnect layer 406 may be coupled with contacts (e.g., the S/D contacts 424) of the device layer 404. The vias 428*b* of the first interconnect layer 406 may be coupled with the lines 428*a* of a second interconnect layer 408**.

The second interconnect layer 408 (referred to as Metal 2 or "M2") may be formed directly on the first interconnect layer 406. In some embodiments, the second interconnect layer 408 may include via **428*b* to couple the lines 428 of the second interconnect layer 408 with the lines 428*a* of a third interconnect layer 410. Although the lines 428*a* and the vias 428*b* are structurally delineated with a line within individual interconnect layers for the sake of clarity, the lines 428*a* and the vias 428*b*** may be structurally and/or materially contiguous (e.g., simultaneously filled during a dual-damascene process) in some embodiments.

The third interconnect layer 410 (referred to as Metal 3 or "M3") (and additional interconnect layers, as desired) may be formed in succession on the second interconnect layer 408 according to similar techniques and configurations described in connection with the second interconnect layer 408 or the first interconnect layer 406. In some embodiments, the interconnect layers that are "higher up" in the metallization stack 419 in the integrated circuit device 400 (i.e., farther away from the device layer 404) may be thicker that the interconnect layers that are lower in the metallization stack 419, with lines **428*a* and vias 428*b*** in the higher interconnect layers being thicker than those in the lower interconnect layers.

The integrated circuit device 400 may include a solder resist material 434 (e.g., polyimide or similar material) and one or more conductive contacts 436 formed on the interconnect layers 406-410. In FIG. 4, the conductive contacts 436 are illustrated as taking the form of bond pads. The conductive contacts 436 may be electrically coupled with the interconnect structures 428 and configured to route the electrical signals of the transistor(s) 440 to external devices. For example, solder bonds may be formed on the one or more conductive contacts 436 to mechanically and/or electrically couple an integrated circuit die including the integrated circuit device 400 with another component (e.g., a printed circuit board or a package substrate, e.g., 112). The integrated circuit device 400 may include additional or alternate structures to route the electrical signals from the interconnect layers 406-410; for example, the conductive contacts 436 may include other analogous features (e.g., posts) that route the electrical signals to external components.

In some embodiments in which the integrated circuit device 400 is a double-sided die, the integrated circuit device 400 may include another metallization stack (not shown) on the opposite side of the device layer(s) 404. This metallization stack may include multiple interconnect layers as discussed above with reference to the interconnect layers 406-410, to provide conductive pathways (e.g., including conductive lines and vias) between the device layer(s) 404 and additional conductive contacts (not shown) on the opposite side of the integrated circuit device 400 from the conductive contacts 436.

In other embodiments in which the integrated circuit device 400 is a double-sided die, the integrated circuit device 400 may include one or more through silicon vias (TSVs) through the die substrate 402; these TSVs may make contact with the device layer(s) 404, and may provide conductive pathways between the device layer(s) 404 and additional conductive contacts (not shown) on the opposite side of the integrated circuit device 400 from the conductive contacts 436. In some embodiments, TSVs extending through the substrate can be used for routing power and ground signals from conductive contacts on the opposite side of the integrated circuit device 400 from the conductive contacts 436 to the transistors 440 and any other components integrated into the die 400, and the metallization stack 419 can be used to route I/O signals from the conductive contacts 436 to transistors 440 and any other components integrated into the die 400.

Multiple integrated circuit devices 400 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 5:
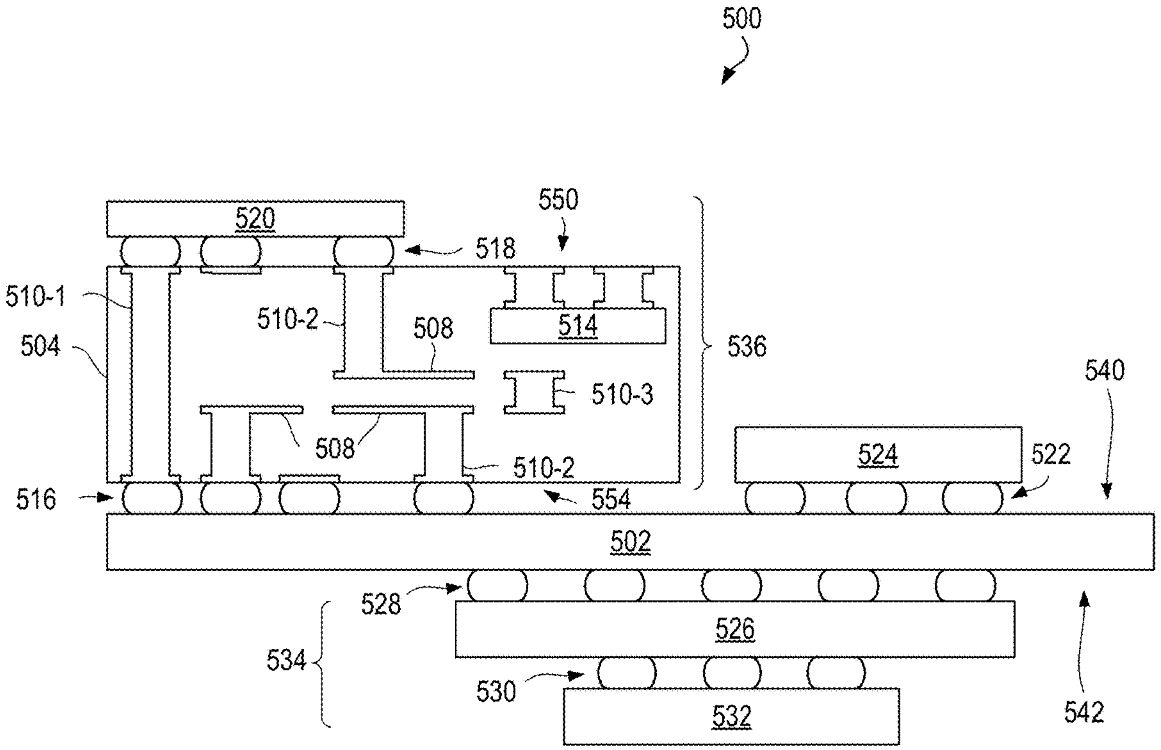
FIG. 5 is a cross-sectional side view of an integrated circuit device assembly that may include embodiments disclosed herein.

FIG. 5 is a cross-sectional side view of an integrated circuit device assembly 500 that may include any of the embodiments disclosed herein. The integrated circuit device assembly 500 includes a number of components disposed on a circuit board 502 (which may be a motherboard, system board, mainboard, etc.). The integrated circuit device assembly 500 includes components disposed on a first face 540 of the circuit board 502 and an opposing second face 542 of the circuit board 502; generally, components may be disposed on one or both faces 540 and 542.

In some embodiments, the circuit board 502 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 502. In other embodiments, the circuit board 502 may be a non-PCB substrate. The integrated circuit device assembly 500 illustrated in FIG. 5 includes a package-on-interposer structure 536 coupled to the first face 540 of the circuit board 502 by coupling components 516. The coupling components 516 may electrically and mechanically couple the package-on-interposer structure 536 to the circuit board 502, and may include solder balls (as shown in FIG. 5), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 536 may include an integrated circuit component 520 coupled to an interposer 504 by coupling components 518. The coupling components 518 may take any suitable form for the application, such as the forms discussed above with reference to the coupling components 516. Although a single integrated circuit component 520 is shown in FIG. 5, multiple integrated circuit components may be coupled to the interposer 504; indeed, additional interposers may be coupled to the interposer 504. The interposer 504 may provide an intervening substrate used to bridge the circuit board 502 and the integrated circuit component 520.

The integrated circuit component 520 may be a packaged or unpacked integrated circuit product that includes one or more integrated circuit dies (e.g., the die 302 of FIG. 3, the integrated circuit device 400 of FIG. 4) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 520, a single monolithic integrated circuit die comprises solder bumps attached to contacts on the die. The solder bumps allow the die to be directly attached to the interposer 504. The integrated circuit component 520 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 520 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 520 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 520 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 504 may spread connections to a wider pitch or reroute a connection to a different connection. For example, the interposer 504 may couple the integrated circuit component 520 to a set of ball grid array (BGA) conductive contacts of the coupling components 516 for coupling to the circuit board 502. In the embodiment illustrated in FIG. 5, the integrated circuit component 520 and the circuit board 502 are attached to opposing sides of the interposer 504; in other embodiments, the integrated circuit component 520 and the circuit board 502 may be attached to a same side of the interposer 504. In some embodiments, three or more components may be interconnected by way of the interposer 504.

In some embodiments, the interposer 504 may be formed as a PCB, including multiple metal layers separated from one another by layers of dielectric material and interconnected by electrically conductive vias. In some embodiments, the interposer 504 may be formed of an epoxy resin, a fiberglass-reinforced epoxy resin, an epoxy resin with inorganic fillers, a ceramic material, or a polymer material such as polyimide. In some embodiments, the interposer 504 may be formed of alternate rigid or flexible materials that may include the same materials described above for use in a semiconductor substrate, such as silicon, germanium, and other group III-V and group IV materials. The interposer 504 may include metal interconnects 508 and vias 510, including but not limited to through hole vias 510-1 (that extend from a first face 550 of the interposer 504 to a second face 554 of the interposer 504), blind vias 510-2 (that extend from the first or second faces 550 or 554 of the interposer 504 to an internal metal layer), and buried vias 510-3 (that connect internal metal layers).

In some embodiments, the interposer 504 can comprise a silicon interposer. Through silicon vias (TSV) extending through the silicon interposer can connect connections on a first face of a silicon interposer to an opposing second face of the silicon interposer. In some embodiments, an interposer 504 comprising a silicon interposer can further comprise one or more routing layers to route connections on a first face of the interposer 504 to an opposing second face of the interposer 504.

The interposer 504 may further include embedded devices 514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 504. The package-on-interposer structure 536 may take the form of any of the package-on-interposer structures known in the art. In embodiments where the interposer is a non-printed circuit board The integrated circuit device assembly 500 may include an integrated circuit component 524 coupled to the first face 540 of the circuit board 502 by coupling components 522. The coupling components 522 may take the form of any of the embodiments discussed above with reference to the coupling components 516, and the integrated circuit component 524 may take the form of any of the embodiments discussed above with reference to the integrated circuit component 520.

The integrated circuit device assembly 500 illustrated in FIG. 5 includes a package-on-package structure 534 coupled to the second face 542 of the circuit board 502 by coupling components 528. The package-on-package structure 534 may include an integrated circuit component 526 and an integrated circuit component 532 coupled together by coupling components 530 such that the integrated circuit component 526 is disposed between the circuit board 502 and the integrated circuit component 532. The coupling components 528 and 530 may take the form of any of the embodiments of the coupling components 516 discussed above, and the integrated circuit components 526 and 532 may take the form of any of the embodiments of the integrated circuit component 520 discussed above. The package-on-package structure 534 may be configured in accordance with any of the package-on-package structures known in the art.

Figure 6:
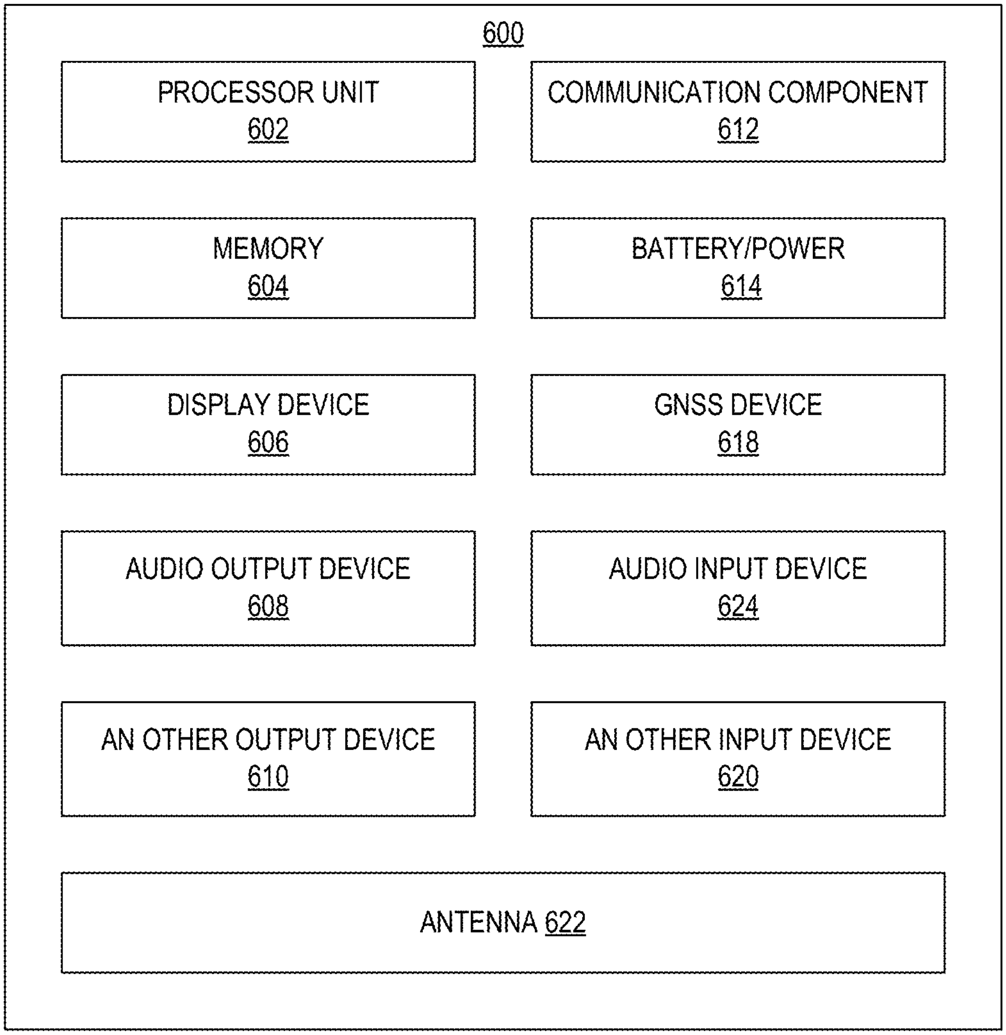
FIG. 6 is a block diagram of an example electrical device that may include a microelectronic assembly, in accordance with any of the embodiments disclosed herein.

FIG. 6 is a block diagram of an example electrical device 600 that may include one or more of the embodiments disclosed herein. For example, any suitable ones of the components of the electrical device 600 may include one or more of assemblies 100, integrated circuit devices 400, or integrated circuit dies 302 disclosed herein. A number of components are illustrated in FIG. 6 as included in the electrical device 600, but any one or more of these components may be omitted or duplicated, as suitable for the application. In some embodiments, some or all of the components included in the electrical device 600 may be attached to one or more motherboards mainboards, or system boards. In some embodiments, one or more of these components are fabricated onto a single system-on-a-chip (SoC) die.

Additionally, in various embodiments, the electrical device 600 may not include one or more of the components illustrated in FIG. 6, but the electrical device 600 may include interface circuitry for coupling to the one or more components. For example, the electrical device 600 may not include a display device 606, but may include display device interface circuitry (e.g., a connector and driver circuitry) to which a display device 606 may be coupled. In another set of examples, the electrical device 600 may not include an audio input device 624 or an audio output device 608, but may include audio input or output device interface circuitry (e.g., connectors and supporting circuitry) to which an audio input device 624 or audio output device 608 may be coupled.

The electrical device 600 may include one or more processor units 602 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 602 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 600 may include a memory 604, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 604 may include memory that is located on the same integrated circuit die as the processor unit 602. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 600 can comprise one or more processor units 602 that are heterogeneous or asymmetric to another processor unit 602 in the electrical device 600. There can be a variety of differences between the processing units 602 in a system in terms of a spectrum of metrics of merit including architectural, microarchitectural, thermal, power consumption characteristics, and the like. These differences can effectively manifest themselves as asymmetry and heterogeneity among the processor units 602 in the electrical device 600.

In some embodiments, the electrical device 600 may include a communication component 612 (e.g., one or more communication components). For example, the communication component 612 can manage wireless communications for the transfer of data to and from the electrical device 600. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 612 may operate in accordance with other wireless protocols in other embodiments. The electrical device 600 may include an antenna 622 to facilitate wireless communications and/or to receive other wireless communications (such as AM or FM radio transmissions).

In some embodiments, the communication component 612 may manage wired communications, such as electrical, optical, or any other suitable communication protocols (e.g., IEEE 802.3 Ethernet standards). As noted above, the communication component 612 may include multiple communication components. For instance, a first communication component 612 may be dedicated to shorter-range wireless communications such as Wi-Fi or Bluetooth, and a second communication component 612 may be dedicated to longer-range wireless communications such as global positioning system (GPS), EDGE, GPRS, CDMA, WiMAX, LTE, EV-DO, or others. In some embodiments, a first communication component 612 may be dedicated to wireless communications, and a second communication component 612 may be dedicated to wired communications.

The electrical device 600 may include battery/power circuitry 614. The battery/power circuitry 614 may include one or more energy storage devices (e.g., batteries or capacitors) and/or circuitry for coupling components of the electrical device 600 to an energy source separate from the electrical device 600 (e.g., AC line power).

The electrical device 600 may include a display device 606 (or corresponding interface circuitry, as discussed above). The display device 606 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 600 may include an audio output device 608 (or corresponding interface circuitry, as discussed above). The audio output device 608 may include any embedded or wired or wirelessly connected external device that generates an audible indicator, such speakers, headsets, or earbuds.

The electrical device 600 may include an audio input device 624 (or corresponding interface circuitry, as discussed above). The audio input device 624 may include any embedded or wired or wirelessly connected device that generates a signal representative of a sound, such as microphones, microphone arrays, or digital instruments (e.g., instruments having a musical instrument digital interface (MIDI) output). The electrical device 600 may include a Global Navigation Satellite System (GNSS) device 618 (or corresponding interface circuitry, as discussed above), such as a Global Positioning System (GPS) device. The GNSS device 618 may be in communication with a satellite-based system and may determine a geolocation of the electrical device 600 based on information received from one or more GNSS satellites, as known in the art.

The electrical device 600 may include another output device 610 (or corresponding interface circuitry, as discussed above). Examples of the other output device 610 may include an audio codec, a video codec, a printer, a wired or wireless transmitter for providing information to other devices, or an additional storage device.

The electrical device 600 may include another input device 620 (or corresponding interface circuitry, as discussed above). Examples of the other input device 620 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 600 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 600 may be any other electronic device that processes data. In some embodiments, the electrical device 600 may comprise multiple discrete physical components. Given the range of devices that the electrical device 600 can be manifested as in various embodiments, in some embodiments, the electrical device 600 can be referred to as a computing device or a computing system.

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 is an apparatus comprising: a first metal layer; a second metal layer above the first metal layer; a first metal via generally perpendicular with and connected to the first metal layer; a second metal via generally perpendicular with and connected to the second metal layer; a third metal via generally perpendicular with and extending through the first metal layer and the second metal layer; a ferroelectric material between the third metal via and the first metal layer and between the third metal via and the second metal layer; and a hard mask material around a portion of the first metal via above the first metal layer and the second metal layer, around a portion of the second metal via above the first metal layer and the second metal layer, and around a portion of the ferroelectric material above the first metal layer and the second metal layer.

Example 2 includes the subject matter of claim 1, wherein the hard mask material is a first hard mask material, the ferroelectric material is a first ferroelectric material, and the apparatus further comprises: a fourth metal via generally perpendicular with and connected to the first metal layer; a fifth metal via generally perpendicular with and connected to the second metal layer; a sixth metal via generally perpendicular with and extending through the first metal layer and the second metal layer; a second ferroelectric material between the sixth metal via and the first metal layer and between the sixth metal via and the second metal layer; a second hard mask material around a portion of the fourth metal via above the first metal layer and the second metal layer, around a portion of the fifth metal via above the first metal layer and the second metal layer, and around a portion of the second ferroelectric material above the first metal layer and the second metal layer; and a dielectric material between the first ferroelectric material and the second ferroelectric material.

Example 3 includes the subject matter of claim 1 or 2, further comprising a fourth metal via extending through the first metal layer and the second metal layer, wherein the ferroelectric material is between the fourth metal via and the first metal layer and between the fourth metal via and the second metal layer.

Example 4 includes the subject matter of any one of claims 1-3, further comprising: a first dielectric layer on the first metal layer, wherein the first metal via extends through the first dielectric layer to connect to the first metal layer; a second dielectric layer on the second metal layer, wherein the second metal via extends through the second dielectric layer to connect to the second metal layer.

Example 5 includes the subject matter of any one of claims 1-4, further comprising a dielectric material between the first metal via and the second metal via and between the second metal via and the third metal via.

Example 6 includes the subject matter of any one of claims 1-5, wherein the ferroelectric material surrounds and is generally concentric with the third metal via.

Example 7 includes the subject matter of any one of claims 1-6, wherein the hard mask material comprises Aluminum and Oxygen.

Example 8 includes the subject matter of any one of claims 1-7, wherein the hard mask material comprises Hafnium and Oxygen.

Example 9 includes the subject matter of any one of claims 1-8, wherein the ferroelectric material comprises Hafnium, Zirconium, and Oxygen.

Example 10 is a method of forming a three-dimensional ferroelectric capacitor structure, comprising: forming a material stack comprising a first sacrificial layer, a second sacrificial layer above the first sacrificial layer, and a dielectric material above the first sacrificial layers and the second sacrificial layer; forming a first metal via connected to the first sacrificial layer and a second metal via connected to the second sacrificial layer; forming a third metal via with a ferroelectric material surrounding the third metal via; etching the dielectric material to expose a top portion of the first metal via, a top portion of the second metal via, and a top portion of the ferroelectric material surrounding the third metal via; and forming a hard mask material around the exposed portions of the first metal via, the second metal layer, and the ferroelectric material; etching the material stack to expose side areas of the first sacrificial layer and the second sacrificial layer; removing the first sacrificial layer and the second sacrificial layer; and depositing metal in place of the removed first sacrificial layer and second sacrificial layer.

Example 11 includes the subject matter of claim 10, wherein the hard mask material is formed using a conformal deposition process.

Example 12 includes the subject matter of claim 11, wherein the conformal deposition process is an atomic layer deposition (ALD) process.

Example 13 includes the subject matter of any one of claims 10-12, wherein the hard mask material comprises Aluminum and Oxygen.

Example 14 includes the subject matter of any one of claims 10-12, wherein the hard mask material comprises Hafnium and Oxygen.

Example 15 includes the subject matter of any one of claims 10-14, wherein the first sacrificial material and the second sacrificial material comprise Silicon and Nitrogen.

Example 16 includes the subject matter of any one of claims 10-15, wherein the dielectric material is a first dielectric material, and the method further comprises depositing a second dielectric material in areas of the material stack not covered by the hard mask material.

Example 17 is a method of forming a three-dimensional ferroelectric capacitor structure, comprising: forming a material stack comprising a first sacrificial layer, a second sacrificial layer above the first sacrificial layer, and a dielectric material above the first sacrificial layers and the second sacrificial layer; forming a first metal via connected to the first sacrificial layer and a second metal via connected to the second sacrificial layer; forming a third metal via with a ferroelectric material surrounding the third metal via; forming a hard mask above the first metal via, the second metal via, and the third metal via using a directed self-assembly (DSA) process; etching the material stack to expose side areas of the first sacrificial layer and the second sacrificial layer; removing the first sacrificial layer and the second sacrificial layer; and depositing metal in place of the removed first sacrificial layer and second sacrificial layer.

Example 18 includes the subject matter of claim 17, wherein forming the hard mask using the DSA process comprises applying a polymer to the material stack, the polymer having a metal selective functional group to bind to the first metal via, the second metal via, and the third metal via.

Example 19 includes the subject matter of claim 18, wherein the polymer is a first polymer and forming the hard mask using the DSA process further comprises applying a second polymer on the material stack, the second polymer chosen to selectively bind with the first polymer.

Example 20 includes the subject matter of any one of claims 17-19, wherein the hard mask material comprises Aluminum and Oxygen.

Example 21 includes the subject matter of any one of claims 17-19, wherein the hard mask material comprises Hafnium and Oxygen.

Example 22 includes the subject matter of any one of claims 17-21, wherein the first sacrificial material and the second sacrificial material comprise Silicon and Nitrogen.

Example 23 includes the subject matter of any one of claims 17-22, wherein the dielectric material is a first dielectric material, and the method further comprises depositing a second dielectric material in areas of the material stack not covered by the hard mask.

Example 24 is an apparatus manufactured according to the method of any one of Examples 10-23.

In the above description, various aspects of the illustrative implementations have been described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials, and configurations have been set forth to provide a thorough understanding of the illustrative implementations. However, it will be apparent to one skilled in the art that the present disclosure may be practiced without all of the specific details. In other instances, well-known features have been omitted or simplified in order not to obscure the illustrative implementations.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The above description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

In various embodiments, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

In various embodiments, the term "adjacent" refers to layers or components that are in physical contact with each other. That is, there is no layer or component between the stated adjacent layers or components. For example, a layer X that is adjacent to a layer Y refers to a layer that is in physical contact with layer Y.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

The invention claimed is:

1. A method of forming a three-dimensional ferroelectric capacitor structure, comprising:

forming a material stack comprising a first sacrificial layer, a second sacrificial layer above the first sacrificial layer, and a dielectric material above the first sacrificial layers and the second sacrificial layer;

forming a first metal via connected to the first sacrificial layer and a second metal via connected to the second sacrificial layer;

forming a third metal via with a ferroelectric material surrounding the third metal via;

etching the dielectric material to expose a top portion of the first metal via, a top portion of the second metal via, and a top portion of the ferroelectric material surrounding the third metal via; and forming a hard mask material around the exposed portions of the first metal via, the second metal layer, and the ferroelectric material;

etching the material stack to expose side areas of the first sacrificial layer and the second sacrificial layer;

removing the first sacrificial layer and the second sacrificial layer; and depositing metal in place of the removed first sacrificial layer and second sacrificial layer.

2. The method of claim 1, wherein the hard mask material is formed using a conformal deposition process.

3. The method of claim 2, wherein the conformal deposition process is an atomic layer deposition (ALD) process.

4. The method of claim 1, wherein the hard mask material comprises Aluminum and Oxygen.

5. The method of claim 1, wherein the hard mask material comprises Hafnium and Oxygen.

6. The method of claim 1, wherein the first sacrificial material and the second sacrificial material comprise Silicon and Nitrogen.

7. The method of claim 1, wherein the dielectric material is a first dielectric material, and the method further comprises depositing a second dielectric material in areas of the material stack not covered by the hard mask material.

8. A method of forming a three-dimensional ferroelectric capacitor structure, comprising:

forming a material stack comprising a first sacrificial layer, a second sacrificial layer above the first sacrificial layer, and a dielectric material above the first sacrificial layers and the second sacrificial layer;

forming a first metal via connected to the first sacrificial layer and a second metal via connected to the second sacrificial layer;

forming a third metal via with a ferroelectric material surrounding the third metal via;

forming a hard mask above the first metal via, the second metal via, and the third metal via using a directed self-assembly (DSA) process;

etching the material stack to expose side areas of the first sacrificial layer and the second sacrificial layer;

removing the first sacrificial layer and the second sacrificial layer; and depositing metal in place of the removed first sacrificial layer and second sacrificial layer.

9. The method of claim 8, wherein forming the hard mask using the DSA process comprises applying a polymer to the material stack, the polymer having a metal selective functional group to bind to the first metal via, the second metal via, and the third metal via.

10. The method of claim 9, wherein the polymer is a first polymer and forming the hard mask using the DSA process further comprises applying a second polymer on the material stack, the second polymer chosen to selectively bind with the first polymer.

11. The method of claim 8, wherein the first sacrificial material and the second sacrificial material comprise Silicon and Nitrogen.

12. The method of claim 8, wherein the dielectric material is a first dielectric material, and the method further comprises depositing a second dielectric material in areas of the material stack not covered by the hard mask.

13. The method of claim 8, further comprising removing the hard mask.

14. A method of forming a three-dimensional ferroelectric capacitor structure, comprising:

forming a material stack comprising alternating layers of sacrificial material and dielectric material;

forming metal vias in the material stack;

forming a ferroelectric material around each respective metal via;

forming a hard mask adjacent the metal vias;

etching the material stack to expose the sacrificial material layers;

removing the sacrificial material;

depositing metal in place of the removed sacrificial material; and depositing a dielectric in areas of the material stack not covered by the hard mask.

15. The method of claim 14, wherein the hard mask is formed above the metal vias using a directed self-assembly (DSA) process.

16. The method of claim 15, wherein forming the hard mask comprises applying a polymer to the metal vias, the polymer having a metal selective functional group to bind to the metal vias.

17. The method of claim 16, wherein the polymer is a first polymer and forming the hard mask further comprises applying a second polymer on the material stack, the second polymer chosen to selectively bind with the first polymer.

18. The method of claim 14, wherein the hard mask is formed by:

exposing a top portion of the ferroelectric material surrounding the metal vias; and forming a hard mask material around the exposed portions of the ferroelectric material.

19. The method of claim 18, wherein the hard mask material is formed using a conformal deposition process.

20. The method of claim 18, wherein the hard mask material comprises Aluminum and Oxygen.

21. The method of claim 18, wherein the hard mask material comprises Hafnium and Oxygen.

22. The method of claim 14, wherein the sacrificial material layers comprise Silicon and Nitrogen.

23. The method of claim 14, further comprising removing the hard mask after depositing the dielectric.

* * * * *